US009935349B2

(12) United States Patent
Johnson et al.

(10) Patent No.: US 9,935,349 B2
(45) Date of Patent: Apr. 3, 2018

(54) TUNABLE EVANESCENT-MODE CAVITY FILTER WITH CLOSED LOOP CONTROL

(71) Applicants: Thomas J. Johnson, Bedford, NH (US); Jack Chuang, Avon, OH (US); Dimitrios Peroulis, West Lafayette, IN (US); Eric Naglich, Alexandria, VA (US); Souleymane Gnanou, Salem, NH (US); Curtis M. Grens, Manchester, NH (US); Mark Hickle, Lafayette, IN (US); Michael D. Sinanis, West Lafayette, IN (US); Mark E. Stuenkel, Goffstown, NH (US); Paul D. Zemany, Amherst, NH (US)

(72) Inventors: Thomas J. Johnson, Bedford, NH (US); Jack Chuang, Avon, OH (US); Dimitrios Peroulis, West Lafayette, IN (US); Eric Naglich, Alexandria, VA (US); Souleymane Gnanou, Salem, NH (US); Curtis M. Grens, Manchester, NH (US); Mark Hickle, Lafayette, IN (US); Michael D. Sinanis, West Lafayette, IN (US); Mark E. Stuenkel, Goffstown, NH (US); Paul D. Zemany, Amherst, NH (US)

(73) Assignees: BAE Systems Information and Electronic Systems Integration Inc., Nashua, NH (US); Purdue Research Foundation, West Lafayette, IN (US)

( * ) Notice: Subject to any disclaimer, the term of this patent is extended or adjusted under 35 U.S.C. 154(b) by 151 days.

(21) Appl. No.: 14/974,324

(22) Filed: Dec. 18, 2015

(65) Prior Publication Data
US 2016/0182013 A1    Jun. 23, 2016

Related U.S. Application Data

(60) Provisional application No. 62/093,700, filed on Dec. 18, 2014.

(51) Int. Cl.
*H01P 1/219*    (2006.01)
*H01P 7/06*    (2006.01)
(Continued)

(52) U.S. Cl.
CPC .............. *H01P 1/219* (2013.01); *H01P 7/065* (2013.01); *H03J 3/04* (2013.01); *H03J 3/20* (2013.01)

(58) Field of Classification Search
CPC .......... H01P 1/219; H01P 1/2088; H01P 7/06; H01P 7/065; H03J 3/04; H03J 3/20
(Continued)

(56) References Cited

U.S. PATENT DOCUMENTS 6,097,263 A * 8/2000 Mueller .............. H01P 1/20336
333/17.1
8,362,853 B2 * 1/2013 Park ........................ H01P 1/127
331/107 DP
(Continued)

OTHER PUBLICATIONS

Liu, X. et al.,"Capacitive Monitoring of Electrostatic MEMS Tunable Evanescent-Mode Cavity Resonators", 2011 EuMA Proceedings of the 6th European Microwave Integrated Circuits Conference, pp. 466-469, Oct. 10-11, 2011, Manchester, UK.*
(Continued)

*Primary Examiner* — Barbara Summons
(74) *Attorney, Agent, or Firm* — Finch & Maloney PLLC; Scott J. Asmus

(57) ABSTRACT

An evanescent-mode cavity filter with an improved MEMS tuner design is disclosed. The MEMS tuner design allows for the independent control of individual poles in a multi-pole filter, which increases the adaptability of the filter in a crowded RF environment. The filter is further designed to minimize tuning voltages and hysteresis effects. A closed loop control system provides highly responsive tuning of the filter. The closed loop control allows for accurate and stable
(Continued)

tuning that compensates for temperature and vibrational effects, while the tuner design enables fast tuning and significantly increases the resolution of the feedback measurement by eliminating charge buildup in the tuner substrate.

18 Claims, 7 Drawing Sheets

(51) Int. Cl.
    *H03J 3/04*         (2006.01)
    *H03J 3/20*         (2006.01)

(58) Field of Classification Search
    USPC ...... 333/17.1, 202, 203, 208, 209, 210, 212, 333/231, 234, 235
    See application file for complete search history.

(56) References Cited

U.S. PATENT DOCUMENTS

| | | | |
|---|---|---|---|
| 8,665,040 B1* | 3/2014 | Chappell | H01P 1/2039 333/174 |
| 9,024,709 B2* | 5/2015 | Joshi | H01P 1/219 333/210 |
| 2008/0252401 A1* | 10/2008 | Margomenos | H01P 1/219 333/210 |
| 2011/0241802 A1 | 10/2011 | Joshi et al. | |

OTHER PUBLICATIONS

Liu, X. et al., "High-Q Tunable Microwave Cavity Resonators and Filters Using SOI-Based RF MEMS Tuners", 2010 IEEE Journal of Microelectromechanical Systems, vol. 19, No. 4, Aug. 2010, pp. 774-784.*

Liu, X. et al., "A 3.4—6.2 GHz Continuously Tunable Electrostatic MEMS Resontor with Quality Factor of 460-530", published in IEEE MTT-S International Microwave Symposium Digest 2009, pp. 1149-1152 and one page IEEE Xplore abstract, Jun. 7-12, 2009, Boston, U.S.A.*

Saeedi, S. et al., "Capacitve-based, closed-loop freqency control of substrate-integrated cavity tunable filters", conference paper Scopus Preview Abstract Only, 2 pages, Oct. 13-16, 2014, San Diego, U.S.A.*

* cited by examiner

TUNABLE EVANESCENT-MODE CAVITY FILTER WITH CLOSED LOOP CONTROL

RELATED APPLICATIONS

This application claims the benefit of U.S. Provisional Patent Application Ser. No. 62/093,700, filed Dec. 18, 2014, which is hereby incorporated by reference in its entirety.

STATEMENT OF GOVERNMENT INTEREST

This invention was made with United States Government support under Contract No. N00014-12-C-0114 awarded by the Office of Naval Research. The United States Government has certain rights in this invention.

TECHNICAL FIELD

The present disclosure relates generally to tunable filters, and more particularly to tunable, evanescent-mode cavity filters.

BACKGROUND

An evanescent-mode cavity filter is a resonant cavity that can be capacitively loaded by including a conical post in the center of the cavity. The post forms a parallel-plate capacitance in a small gap between the top of the post and the ceiling of the cavity. The ceiling of the cavity can be a movable structure, such as a flexible piezoelectric or MEMS electrostatically actuated membrane, so as to change the loading capacitance, thus allowing for tuning of the center frequency of the resonant cavity. Further details about tunable, evanescent-mode cavity filters may be found, for example, in U.S. Pat. No. 9,024,709 to Joshi et al., the entirety of which is hereby incorporated by reference.

There is a need to increase the responsiveness, accuracy, and stability of a series of tunable filters that cover a frequency range from approximately 1 to 110 GHz, while greatly reducing C-SWAP (Critical-Size, Weight and Power) and improving the filter performance beyond that of existing switched fixed filter systems.

SUMMARY

In accordance with an embodiment of the present disclosure, a tunable, evanescent-mode cavity filter is provided. The filter includes a substrate having a cavity formed therein, a capacitive post disposed in the cavity of the substrate, a flexible diaphragm over and separated from the capacitive post by a gap, an actuator disposed adjacent to the flexible diaphragm and configured to vary the gap between the flexible diaphragm and the capacitive post, and a capacitive sense terminal coupled to the actuator for measuring a capacitance associated with a notch frequency of the filter. The actuator and the capacitive sense terminal are each configured to be coupled to a closed loop control system for tuning the filter. In some cases, the closed loop control system includes a converter configured to convert the measured capacitance into a digital signal, a controller configured to convert the digital signal into a voltage control signal, and a voltage driver configured to generate a high voltage signal for tuning the filter based on the voltage control signal. In some such cases, the controller includes a field programmable gate array (FPGA), although other processor environments capable of converting the digital signal representative of the capacitance into a voltage control signal can be used. In some cases, the filter includes the closed loop control system. In some cases, the actuator includes a substrate having an opening therethrough, the opening being adjacent to the flexible diaphragm, a dielectric layer disposed on the substrate and over the opening, and an electrical contact directly coupled to a portion of the dielectric layer that is over the opening. In some such cases, the actuator includes a dielectric spacer disposed adjacent to the electrical contact, thereby providing for a dielectric-barrier to prohibit the accumulation of sensing charge and bias charge in the actuator substrate. In some cases, the filter includes a plurality of actuators, where each actuator is configured to be decoupled from each of the other actuators to enable independent tuner control and sensing. In some cases, the filter is configured to have a tunable response in a range of frequencies between approximately 1 gigahertz and 110 gigahertz. In some cases, the filter is configured to provide absorptive rejection over 60 decibels and a tunable response within an operational frequency band of between approximately 1 gigahertz and 110 gigahertz.

In accordance with another embodiment of the present disclosure, a methodology of tuning an evanescent-mode cavity filter is provided. The method of tuning the filter includes measuring, via a capacitive sense terminal, a capacitance of a filter, converting the measured capacitance into a digital signal, converting the digital signal into a voltage control signal, and generating a high voltage signal for tuning the filter based on the voltage control signal, where the filter includes a substrate having a cavity formed therein, a capacitive post disposed in the cavity of the substrate, a flexible diaphragm over and separated from the capacitive post by a gap, and an actuator coupled to the capacitive sense terminal and disposed adjacent to the flexible diaphragm, the actuator being configured to vary the gap between the flexible diaphragm and the capacitive post. In some cases, the converting of the measured capacitance into a digital signal includes generating a pulse width modulated digital signal. In some cases, the actuator includes a substrate having an opening therethrough, the opening being adjacent to the flexible diaphragm, a dielectric layer disposed on the substrate and over the opening, and an electrical contact directly coupled to a portion of the dielectric layer that is over the opening. In some such cases, the actuator includes a dielectric spacer disposed adjacent to the electrical contact, thereby providing for a dielectric-barrier to prohibit the accumulation of sensing charge and bias charge in the actuator substrate. In some cases, the filter includes a plurality of actuators, and the method includes decoupling each of the actuators from each of the other actuators to enable independent tuner control and sensing. In some cases, the filter is configured to have a tunable response in a range of frequencies between approximately 1 gigahertz and 110 gigahertz. In some cases, the filter is configured to provide absorptive rejection over 60 decibels and a tunable response within an operational frequency band of between approximately 1 gigahertz and 110 gigahertz.

In accordance with yet another embodiment of the present disclosure, a tunable filter is provided. The tunable filter includes an evanescent-mode cavity filter, and a closed loop control means for tuning the evanescent-mode cavity filter based on a measured capacitance associated with a notch frequency of the evanescent-mode cavity filter. In some cases, the closed loop control means includes a converter configured to convert the measured capacitance into a digital signal, a controller configured to convert the digital signal into a voltage control signal, and a voltage driver configured to generate a high voltage signal for tuning the evanescent-mode cavity filter based on the voltage control signal. In some cases, the evanescent-mode cavity filter includes a flexible diaphragm, a substrate having an opening therethrough, the opening being adjacent to the flexible diaphragm, a dielectric layer disposed on the substrate and over the opening, and an electrical contact directly coupled to a portion of the dielectric layer that is over the opening. In some such cases, the evanescent-mode cavity filter includes a dielectric spacer disposed adjacent to the electrical contact, thereby providing for a dielectric-barrier to prohibit the accumulation of sensing charge and bias charge in the substrate.

BRIEF DESCRIPTION OF THE DRAWINGS

Embodiments of the present disclosure are further described with reference to the accompanying drawings wherein.

DETAILED DESCRIPTION

According to an embodiment of the present disclosure, an evanescent-mode cavity filter with an improved MEMS (microelectromechanical systems) tuner design is provided. The MEMS tuner design allows for independent control of individual poles in a multi-pole filter, which increases the adaptability of the filter in a crowded radio frequency (RF) environment. The filter is further designed to minimize tuning voltages and hysteresis effects. According to another embodiment of the present disclosure, a closed loop control system provides highly responsive tuning of the filter. The closed loop control allows for accurate and stable tuning that compensates for temperature and vibrational effects, while the tuner design enables fast tuning and significantly increases the resolution of the feedback measurement by eliminating bias charge buildup on the tuner substrate. Numerous configurations and variations will be apparent in light of this disclosure.

Figure 1:
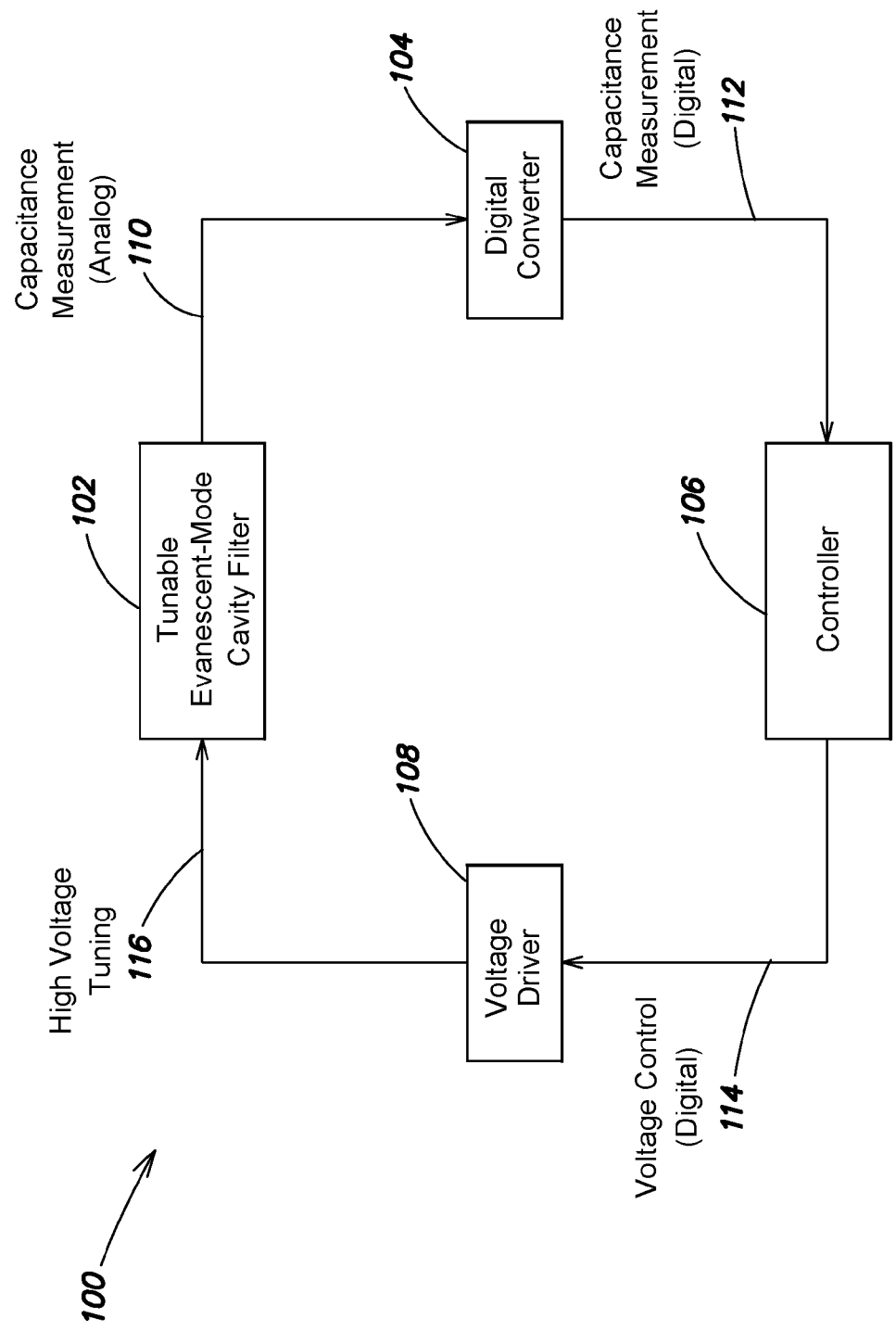
FIG. 1 is a schematic drawing showing an example closed loop control system for tuning an evanescent-mode cavity filter, in accordance with an embodiment of the present disclosure.

FIG. 1 is a block diagram of an example closed loop control system 100 for tuning an evanescent-mode cavity filter 102, in accordance with an embodiment of the present disclosure. The system includes the filter 102, a digital converter 104, a controller 106, and a voltage driver 108. As will be described in further detail below, the filter 102 includes components configured to measure a port capacitance of a notch frequency of the filter, and to output an analog signal 110 representing the capacitance measurement. The digital converter 104 is configured to convert the analog signal 110 into a digital signal 112 representing the capacitance measurement. The digital converter 104 may, for example, be configured to convert the analog signal 110 into the digital signal 112 using pulse width modulation (PWM). The controller 106 is configured to convert the digital signal 112 into a digital voltage control signal 114 using a closed loop feedback control algorithm. The control algorithm has a priori knowledge of the relationship between the sense capacitance of the filter 102 and the RF frequency response of the filter 102. The control algorithm compares a digital capacitance measurement of the filter 102 to a capacitance that corresponds to the desired RF frequency response of the filter 102, and generates the digital voltage control signal 114 based on the comparison so as to drive the filter 102 toward the desired RF frequency response. The controller 106 may include, for example, a field programmable gate array (FPGA), or other suitable processor. The voltage driver 108 is configured to convert the digital voltage control signal 114 into a high voltage tuning signal 116, which drives the filter 102. In some cases, the high voltage tuning signal is less than approximately 100 volts.

According to an embodiment, the closed loop control system 100 can be configured to provide correction of any set point error caused by a bias in setting the measured capacitance, correction of a disturbance caused by vibration, reduction of any settling time caused by a highly overdamped MEMS tuner, correction of any bias effect in the control voltage caused by the capacitance measurement component, mapping of a nonlinear control voltage to a capacitance needed to tune the filter to the desired notch frequency, or any combination of these features and aspects. Further, the system 100 can be used in conjunction with a tunable, evanescent mode cavity filter that provides a high Q (quality factor), with low insertion loss and large absorptive rejection.

Figure 2:
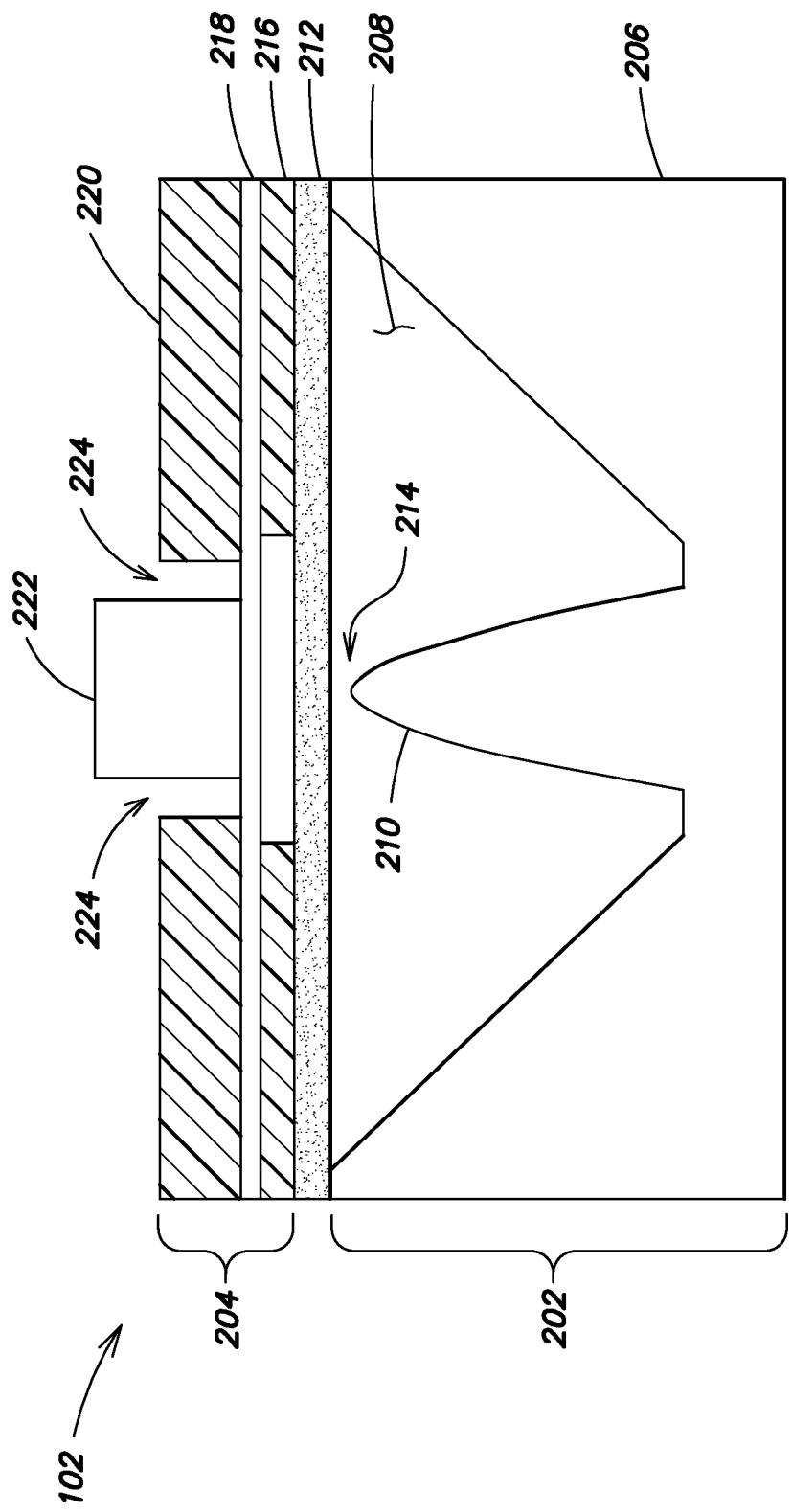
FIG. 2 is a cutaway side view of an example evanescent-mode cavity filter, in accordance with an embodiment of the present disclosure.

FIG. 2 is a cutaway side view of the example evanescent-mode cavity filter 102, in accordance with an embodiment of the present disclosure. FIG. 2 is not intended to be drawn to scale, and it will be understood that certain elements and dimensions may be enlarged, distorted or exaggerated for clarity. The filter 102 generally includes a cavity block 202 and a tuner block 204. The cavity block 202 includes a substrate 206 having a cavity 208 formed therein. The cavity block 202 further includes a capacitive post 210 disposed in the cavity 208. A flexible diaphragm 212 or membrane is disposed over the cavity 208 and separated from the capacitive post 210 by a gap 214, which in various cases may be up to approximately 10 micrometers wide and adjustable up to approximately 30 micrometers wide (e.g., by using an actuator to draw the flexible diaphragm 212 away from the post 210, such as described in further detail below).

The tuner block 204 includes an actuator disposed adjacent to the flexible diaphragm 212 and configured to vary the gap 214 between the flexible diaphragm 212 and the capacitive post 210. In some embodiments, the actuator includes a substrate 216 (e.g., a silicon substrate) having an opening through the substrate 216 and adjacent to the flexible diaphragm 212. The actuator further includes a non-conductive dielectric layer 218 (e.g., a silicon dioxide material) disposed on the substrate 216 and spanning the opening. The actuator may further include another substrate 220 (e.g., a silicon substrate) disposed over a portion of the dielectric layer 218. The substrate 220 may include an opening through which an electrical contact 222 is directly coupled to a portion of the dielectric layer 218 that is over the opening. An additional dielectric spacer 224 separates the electrical contact 222 from the substrate 220.

In operation, the tuner block 204 can vary the gap 214 between the flexible diaphragm 212 and the capacitive post 210, thereby tuning the center frequency of the filter 102. Such a filter design can be variously scaled in size and configuration to provide a tunable response over a frequency range of anywhere between approximately 1 and 110 GHz.

Figure 3:
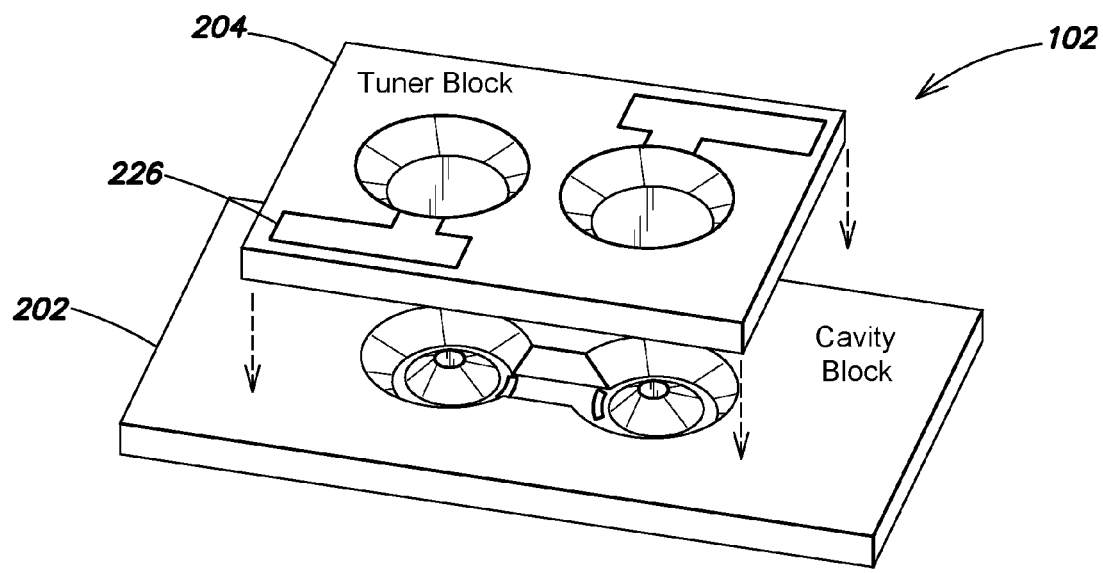
FIG. 3 is a perspective partially exploded view of an example evanescent-mode cavity filter, in accordance with an embodiment of the present disclosure.
Figure 4:
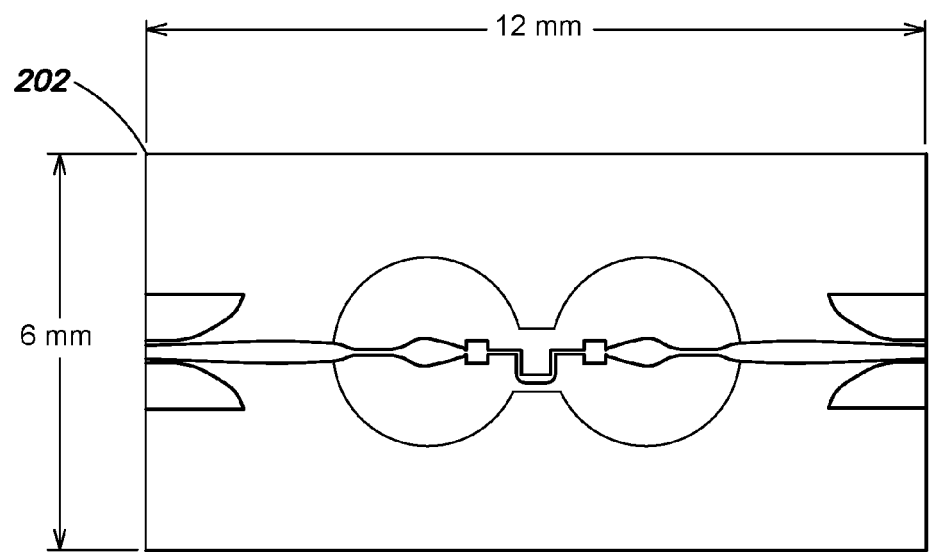
FIG. 4 is a bottom view of an example evanescent-mode cavity filter, in accordance with an embodiment of the present disclosure.

In some embodiments, the filter 102 may include multiple cavity filters and corresponding actuators formed in monolithic tuner blocks, such as shown in FIGS. 3 and 4. In such embodiments, the tuner can be configured to allow simultaneous and independent control over each cavity filter, with reduced hysteresis effects in comparison to existing filters.

FIG. 3 is a perspective view of the example evanescent-mode cavity filter 102 of FIG. 2, and FIG. 4 is a bottom view of the cavity block of the example evanescent-mode cavity filter 102 of FIG. 2, in accordance with an embodiment of the present disclosure. It will be understood that the dimensions shown in FIG. 4 represent one example filter and that other embodiments of the filter 102 may have different dimensions. In this embodiment, the tuner block 204 includes a capacitive sense terminal 226 coupled to the actuator for measuring a capacitance associated with a notch frequency of the filter 102. The actuator and the capacitive sense terminal 226 are each configured to be coupled to the closed loop control system 100 of FIG. 1 for tuning the filter.

Figure 5:
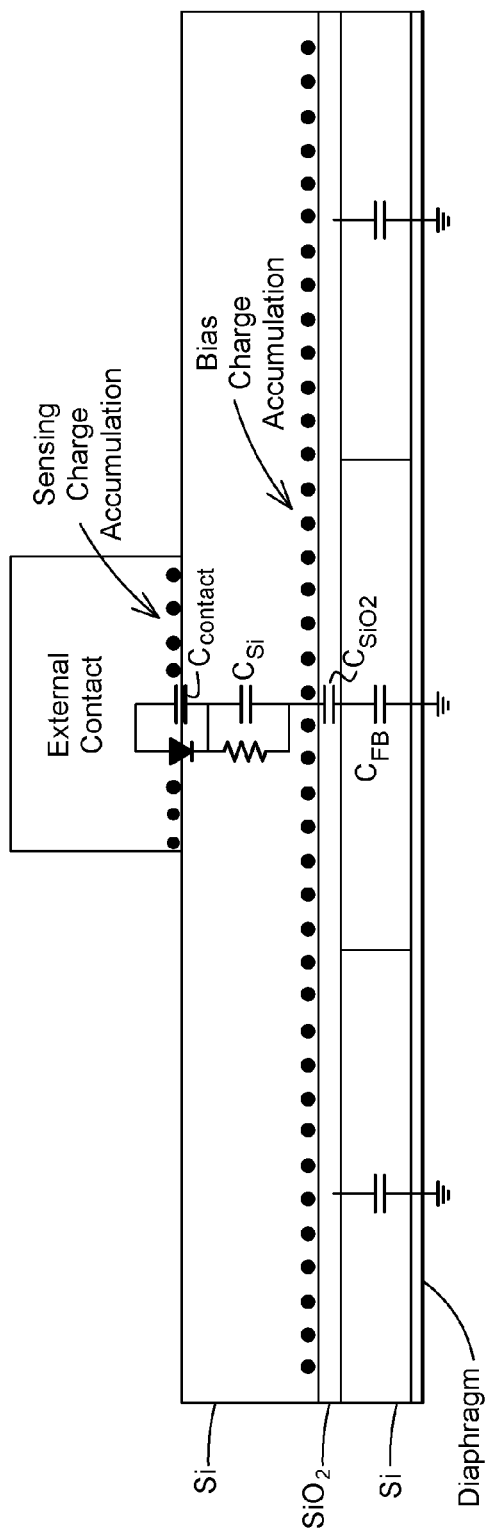
FIG. 5 is a cutaway side view of an existing MEMS tuner block.
Figure 6:
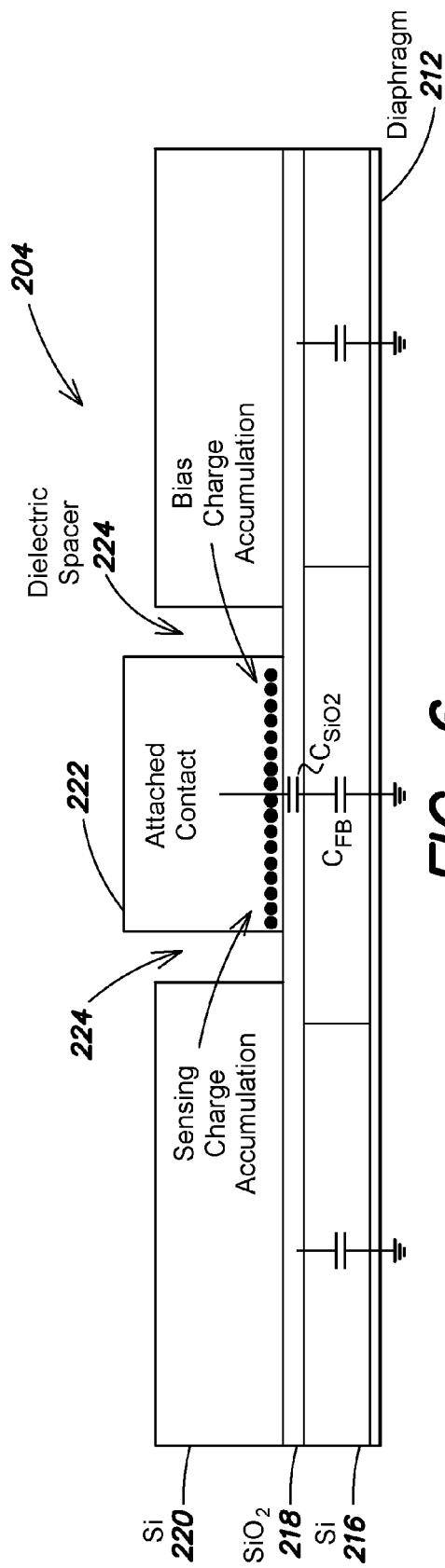
FIG. 6 is a cutaway side view of an example MEMS tuner block, in accordance with an embodiment of the present disclosure.

FIG. 5 is a cutaway side view of an existing MEMS tuner block. FIG. 5 shows the locations of a sensing charge accumulation at the base of the contact, and a bias charge accumulation in the substrate of the tuner block. FIG. 6 is a cutaway side view of an example MEMS tuner block (e.g., the tuner block 204 of FIG. 2), in accordance with an embodiment of the present disclosure. As shown in FIG. 6, the configuration of the electrical contact 222 on the dielectric layer 218 surrounded with a dielectric spacer 224 eliminates the bias charge accumulation in the substrate 220, as in the existing tuner block of FIG. 5, which enables the tuner block 204 to provide a fast tuning response, while also greatly increasing the resolution of the feedback capacitance measurement.

Figure 7:
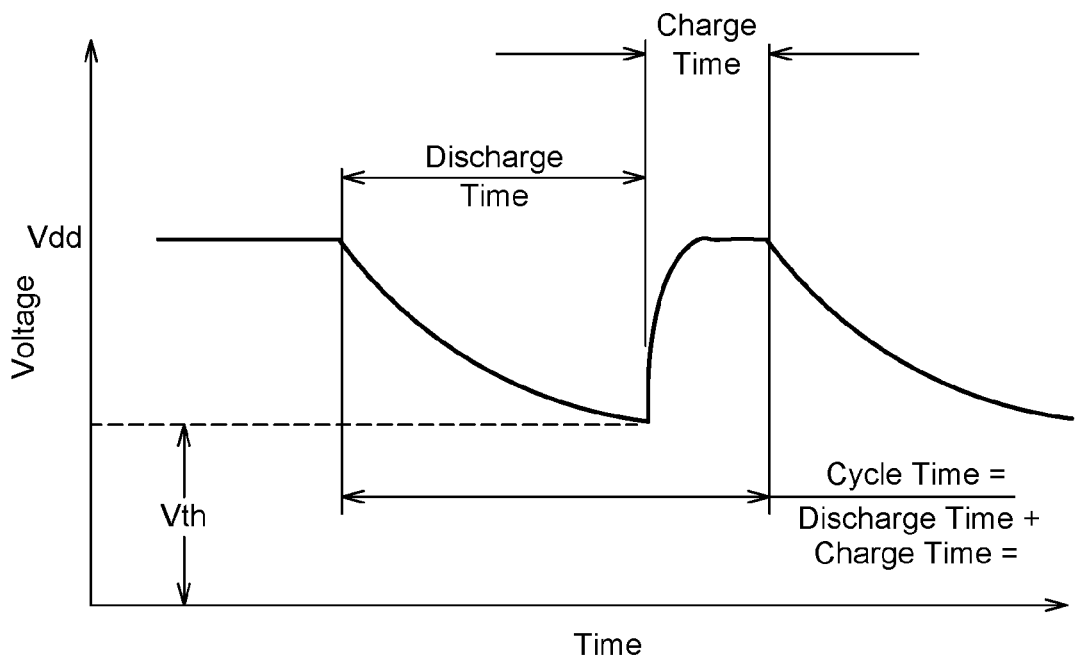
FIG. 7 is a graph showing an example capacitance measurement methodology for tuning an evanescent-mode cavity filter, in accordance with an embodiment of the present disclosure.

FIG. 7 is a graph showing an example capacitance measurement methodology for tuning an evanescent-mode cavity filter, in accordance with an embodiment of the present disclosure. Capacitance of the filter 102 can be measured by periodically analyzing the rate at which a voltage applied to the flexible diaphragm 212 decays (labelled "Discharge Time" in FIG. 7). The frequency of the capacitance measurement signal modulates the position of the flexible diaphragm 212 and sets a limit to the maximum update rate of the closed loop control system 100. In some embodiments, the frequency of the signal is set to a value high enough to cause minimal perturbation of the flexible diaphragm 212, therefore causing minimal effect on the filter response.

Figure 8:
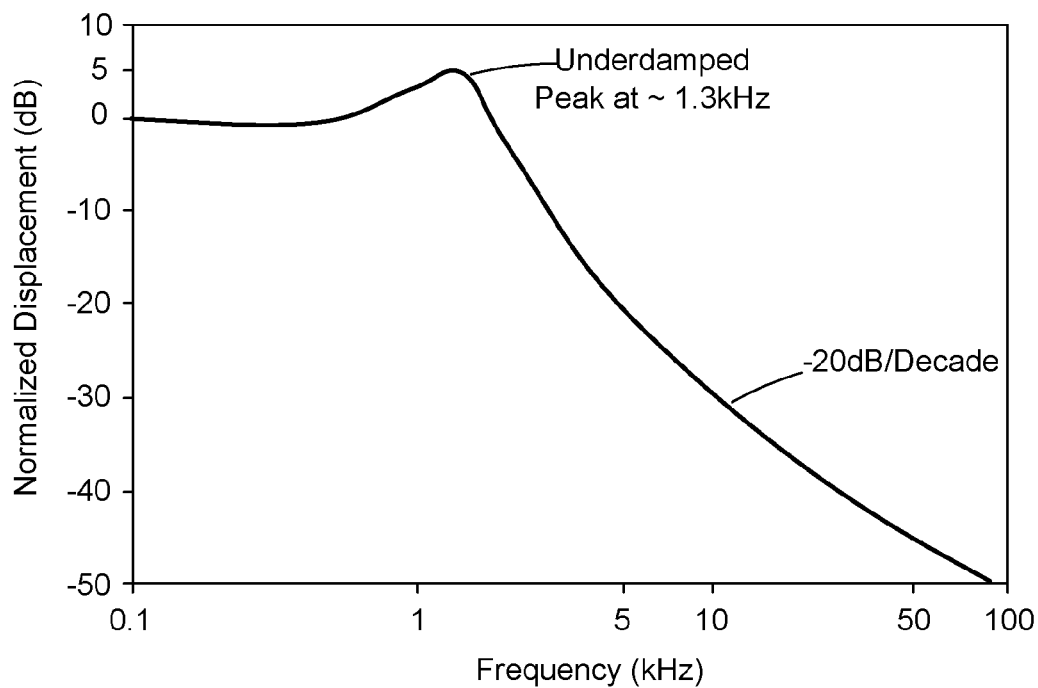
FIG. 8 is a graph showing an example mechanical frequency response of an example tunable, evanescent-mode cavity filter, in accordance with an embodiment of the present disclosure.

FIG. 8 is a graph showing an example mechanical frequency response of an example tunable, evanescent-mode cavity filter, in accordance with an embodiment of the present disclosure. In some embodiments, the frequency of the signal used to modulate the position of the flexible diaphragm for measuring the capacitance of the filter is greater than the mechanical resonance frequency of the diaphragm.

Figure 9:
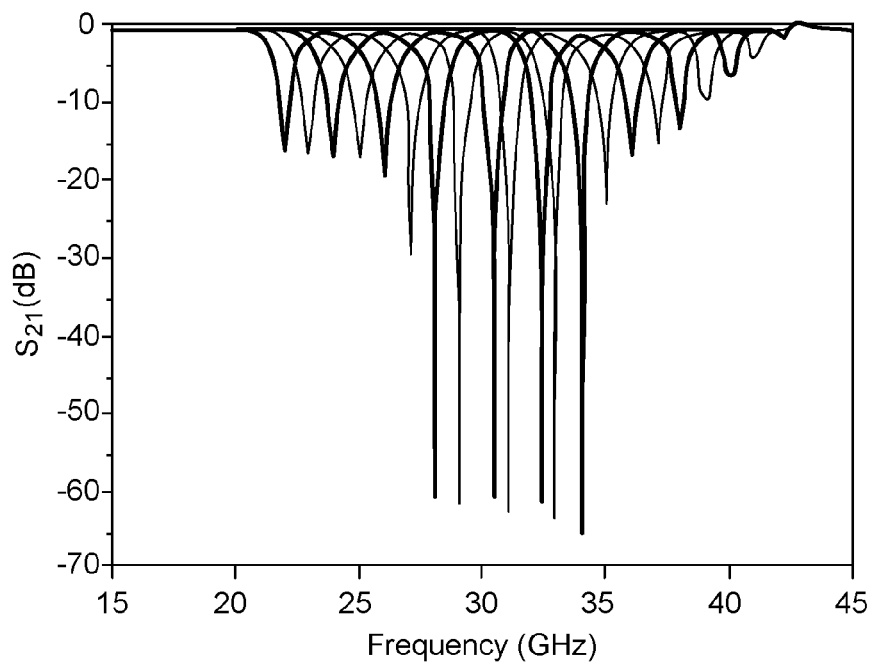
FIG. 9 is a graph showing an example frequency response of a closed loop control system for tuning an evanescent-mode cavity filter, in accordance with an embodiment of the present disclosure.

FIG. 9 is a graph showing an example frequency response of a closed loop control system for tuning an evanescent-mode cavity filter, in accordance with an embodiment of the present disclosure.

Figure 10:
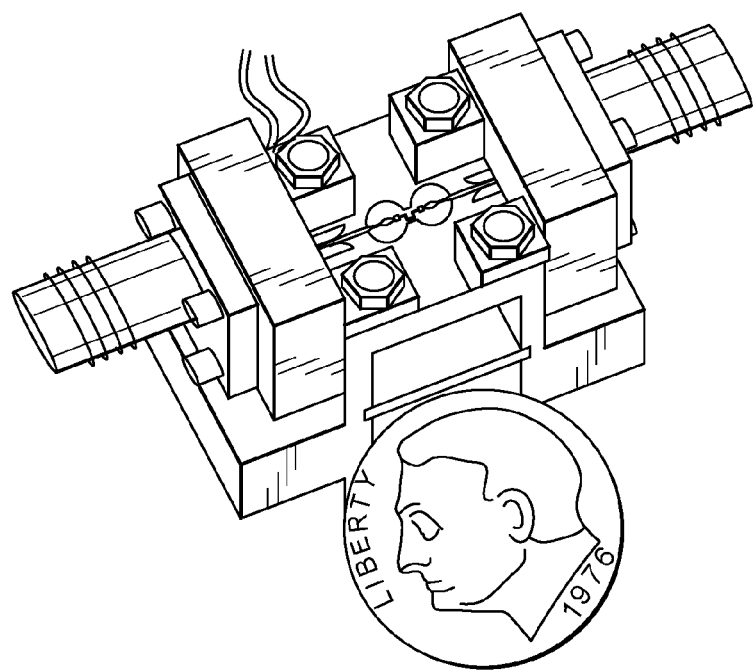
FIG. 10 is a photograph of an example 20-40 GHz evanescent-mode cavity filter, in accordance with an embodiment of the present disclosure.

FIG. 10 is a photograph of an example 20-40 GHz evanescent-mode cavity filter, in accordance with an embodiment of the present disclosure.

Figure 11:
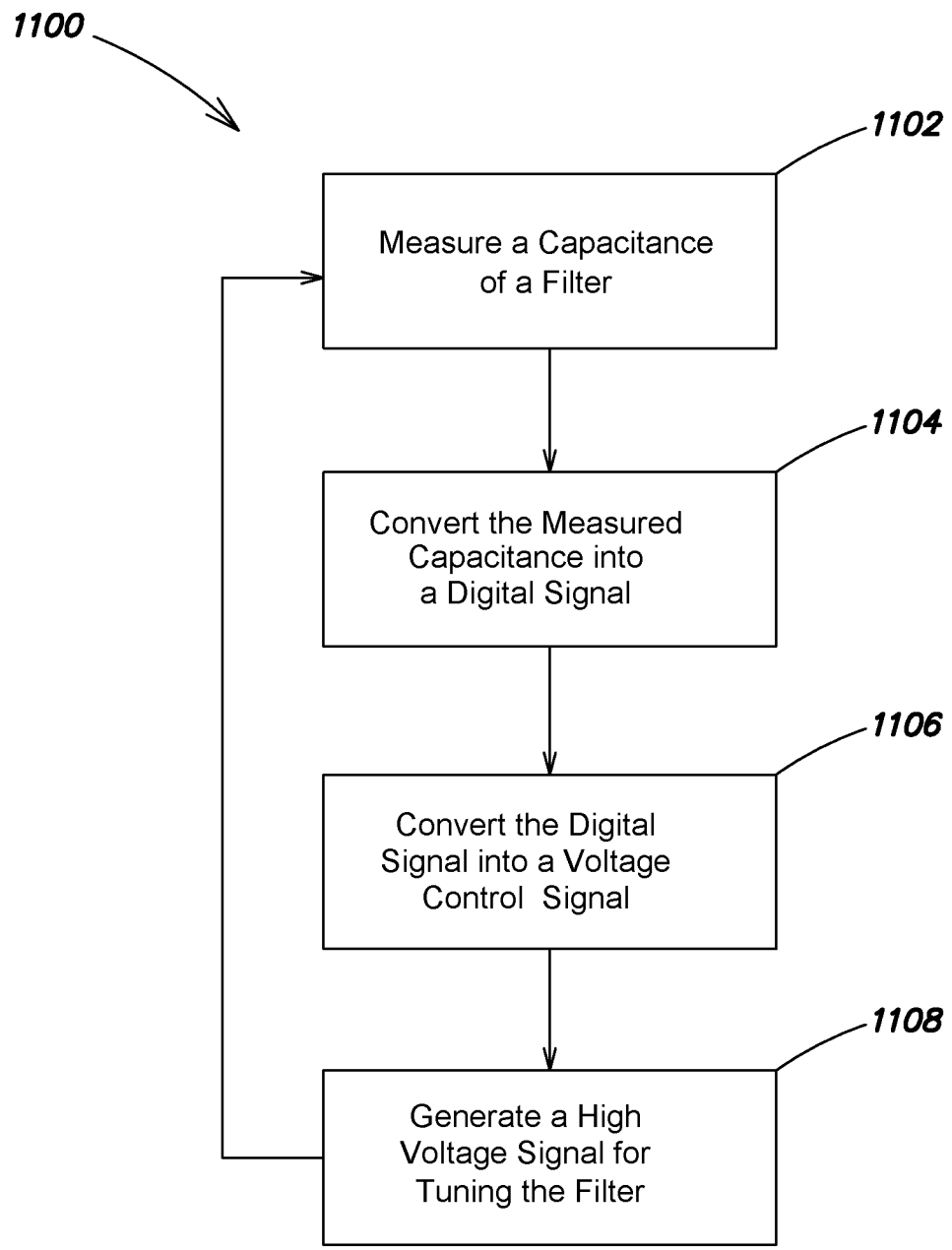
FIG. 11 is a flow diagram showing an example methodology for tuning an evanescent-mode cavity filter, in accordance with an embodiment of the present disclosure.

FIG. 11 is a flow diagram showing an example methodology 1100 for tuning an evanescent-mode cavity filter (e.g., the filter 102 of FIG. 2), in accordance with an embodiment of the present disclosure. The method 1100 may, for example, be implemented by all or portions of the closed loop control system 100 of FIG. 1. The method 1100 begins by measuring 1102, via a capacitive sense terminal (e.g., the capacitive sense terminal 226 of FIG. 3), a capacitance of a filter. The method 1100 continues by converting 1104 the measured capacitance into a digital signal, converting 1106 the digital signal into a voltage control signal, and generating 1108 a high voltage signal for tuning the filter based on the voltage control signal. In some cases, the converting 1104 of the measured capacitance into a digital signal includes generating a pulse width modulated digital signal. In some cases, the filter includes a substrate having a cavity formed therein, a capacitive post disposed in the cavity of the substrate, a flexible diaphragm over and separated from the capacitive post by a gap, and an actuator coupled to the capacitive sense terminal and disposed adjacent to the flexible diaphragm. The actuator is configured to vary the gap between the flexible diaphragm and the capacitive post. In some cases, the actuator includes a substrate having an opening therethrough, the opening being adjacent to the flexible diaphragm. The actuator further includes a dielectric layer disposed on the substrate and over the opening, and an electrical contact directly coupled to a portion of the dielectric layer that is over the opening. In some cases, the actuator includes a dielectric spacer disposed adjacent to the electrical contact, thereby providing for a dielectric-barrier to prohibit sense charge and bias charge accumulation in the substrate, and decoupling multiple actuator electrodes to enable independent tuner control and sensing. In some cases, the filter is configured to have a tunable response in a range of frequencies between approximately 1 gigahertz and 110 gigahertz. In some cases, the filter is configured to provide absorptive rejection over 60 decibels and a tunable response within an operational frequency band of between approximately 1 gigahertz and 110 gigahertz.

Those skilled in the art will appreciate that embodiments of the present disclosure provide responsive and stable tuning responses over a large operating range (e.g., approximately 1 to 110 GHz). By contrast, existing tunable filters generally have a maximum frequency of around 4 GHz. Furthermore, in contrast to various embodiments, existing MEMS tunable filters generally have poor tuning response times and bad feedback resolution resulting from a charge being trapped inside the tuner as it is tuned, such as shown in FIG. 5. Other existing solutions include banks of switched fixed filters, which may require many filters and may degrade C-SWAP and other performance characteristics.

While various embodiments have been described with respect to several example embodiments, it will be understood that other similar embodiments may be used or modifications or additions may be made to the described embodiments for performing the same or similar functions without deviating from the scope of the disclosure. Therefore, the present invention should not be limited to any single embodiment, but rather construed in breadth and scope in accordance with the recitation of the appended claims.

What is claimed is:

1. A tunable, evanescent-mode cavity filter, comprising:
a substrate having a cavity formed therein;
a capacitive post disposed in the cavity of the substrate;
a flexible diaphragm over and separated from the capacitive post by a gap;
an actuator disposed adjacent to the flexible diaphragm and configured to vary the gap between the flexible diaphragm and the capacitive post; and
a capacitive sense terminal coupled to the actuator for measuring a capacitance associated with a notch frequency of the filter,
wherein the actuator and the capacitive sense terminal are each configured to be coupled to a closed loop control system for tuning the filter; and
wherein said closed loop control system further comprises
a converter configured to convert the measured capacitance into a digital signal;
a controller configured to convert the digital signal into a voltage control signal; and
a voltage driver configured to generate a high voltage signal for tuning the filter based on the voltage control signal.

2. The filter of claim 1, wherein the controller includes a field programmable gate array (FPGA).

3. The filter of claim 1, wherein the filter is coupled to the closed loop control system.

4. The filter of claim 1, wherein the actuator comprises:
a substrate having an opening therethrough, the opening being adjacent to the flexible diaphragm;
a dielectric layer disposed on the substrate and over the opening; and
an electrical contact directly coupled to a portion of the dielectric layer that is over the opening.

5. The filter of claim 4, wherein the actuator further comprises:
a dielectric spacer disposed adjacent to the electrical contact, thereby providing for a dielectric-barrier to prohibit the accumulation of sensing charge and bias charge in the actuator substrate.

6. The filter of claim 1, wherein the filter comprises a plurality of actuators, wherein each actuator is configured to be decoupled from each of the other actuators to enable independent tuner control and sensing.

7. The filter of claim 1, wherein the filter is configured to have a tunable response in a range of frequencies between approximately 1 gigahertz and 110 gigahertz.

8. The filter of claim 1, wherein the filter is configured to provide absorptive rejection over 60 decibels and a tunable response within an operational frequency band of between approximately 1 gigahertz and 110 gigahertz.

9. A method of tuning an evanescent-mode cavity filter, the method comprising:
measuring, via a capacitive sense terminal, a capacitance of a filter;
converting the measured capacitance into a digital signal;
converting the digital signal into a voltage control signal; and
generating a high voltage signal for tuning the filter based on the voltage control signal,
wherein the filter comprises:
a substrate having a cavity formed therein;
a capacitive post disposed in the cavity of the substrate;
a flexible diaphragm over and separated from the capacitive post by a gap; and
an actuator coupled to the capacitive sense terminal and disposed adjacent to the flexible diaphragm, the actuator being configured to vary the gap between the flexible diaphragm and the capacitive post.

10. The method of claim 9, wherein the converting of the measured capacitance into a digital signal comprises generating a pulse width modulated digital signal.

11. The method of claim 9, wherein the actuator comprises:
a substrate having an opening therethrough, the opening being adjacent to the flexible diaphragm;
a dielectric layer disposed on the substrate and over the opening; and
an electrical contact directly coupled to a portion of the dielectric layer that is over the opening.

12. The method of claim 11, wherein the actuator further comprises:
a dielectric spacer disposed adjacent to the electrical contact, thereby providing for a dielectric-barrier to prohibit the accumulation of sensing charge and bias charge in the actuator substrate.

13. The method of claim 9, wherein the filter comprises a plurality of actuators, and wherein the method comprises decoupling each of the actuators from each of the other actuators to enable independent tuner control and sensing.

14. The method of claim 9, wherein the filter is configured to have a tunable response in a range of frequencies between approximately 1 gigahertz and 110 gigahertz.

15. The method of claim 9, wherein the filter is configured to provide absorptive rejection over 60 decibels and a tunable response within an operational frequency band of between approximately 1 gigahertz and 110 gigahertz.

16. A tunable filter, comprising:
an evanescent-mode cavity filter; and
a closed loop control means for tuning the evanescent-mode cavity filter based on a measured capacitance associated with a notch frequency of the evanescent-mode cavity filter, wherein the closed loop control means further comprises
a converter configured to convert the measured capacitance into a digital signal;
a controller configured to convert the digital signal into a voltage control signal; and
a voltage driver configured to generate a high voltage signal for tuning the evanescent-mode cavity filter based on the voltage control signal.

17. The filter of claim 16, wherein the evanescent-mode cavity filter comprises:
a flexible diaphragm;
a substrate having an opening therethrough, the opening being adjacent to the flexible diaphragm;
a dielectric layer disposed on the substrate and over the opening; and
an electrical contact directly coupled to a portion of the dielectric layer that is over the opening.

18. The filter of claim 17, wherein the evanescent-mode cavity filter further comprises:
   a dielectric spacer disposed adjacent to the electrical contact, thereby providing for a dielectric-barrier to prohibit the accumulation of sensing charge and bias charge in the substrate.

* * * * *